(12) United States Patent
Gaynor et al.

(10) Patent No.: US 10,559,544 B2
(45) Date of Patent: Feb. 11, 2020

(54) SEMICONDUCTOR DEVICE WITH INTEGRATED ANTENNA AND MANUFACTURING METHOD THEREFOR

(71) Applicant: Microsoft Corporation, Redmond, WA (US)

(72) Inventors: Michael Gaynor, Crystal Lake, IL (US); Brian Collins, Cambridge (GB)

(73) Assignee: Microsoft Technology Licensing, LLC, Redmond, WA (US)

( * ) Notice: Subject to any disclaimer, the term of this patent is extended or adjusted under 35 U.S.C. 154(b) by 710 days.

(21) Appl. No.: 14/199,146

(22) Filed: Mar. 6, 2014

(65) Prior Publication Data

US 2014/0217564 A1 Aug. 7, 2014

Related U.S. Application Data

(63) Continuation of application No. 13/140,531, filed as application No. PCT/GB2009/051667 on Dec. 8, 2009, now Pat. No. 8,703,574.

(30) Foreign Application Priority Data

Dec. 17, 2008 (GB) .................................. 08229635

(51) Int. Cl.
*H01L 21/76* (2006.01)
*H01L 23/66* (2006.01)

(52) U.S. Cl.
CPC .................................. *H01L 23/66* (2013.01)

(58) Field of Classification Search
CPC ....... H01L 2924/00; H01L 2224/73265; H01L 2224/48247; H01L 2224/32245;
(Continued)

(56) References Cited

U.S. PATENT DOCUMENTS 6,373,447 B1 * 4/2002 Rostoker .......... G06K 19/07749
343/895
6,379,988 B1 4/2002 Peterson et al.
(Continued)

FOREIGN PATENT DOCUMENTS

DE 10138659 3/2003
GB 2403069 12/2004
(Continued)

OTHER PUBLICATIONS

International Searching Authority, International Search Report and Written Opinion issued in Application No. PCT/GB2009/051667, 7 pages.

*Primary Examiner* — Robert G Bachner
(74) *Attorney, Agent, or Firm* — Holzer Patel Drennan

(57) ABSTRACT

There is disclosed a package comprising at least an integrated circuit embedded in an electrically non-conductive moulded material. The moulded material includes at least one moulded pattern on at least one surface thereof, and at least one electrically conductive track in the pattern. There is further provided at least one capacitive, inductive or galvanic component electrically connecting between at least two parts of the at least one electrically conductive track. The conductive track can be configured as antenna, and the capacitive, inductive or galvanic component is used to adjust tuning and other characteristics of the antenna.

24 Claims, 7 Drawing Sheets

(58) Field of Classification Search
CPC . H01L 2224/48227; H01L 2224/32225; H01L 2924/00012; H01L 2924/3011; H01L 2224/49171; H01L 2924/0002; H01L 2924/1305; H01L 2924/1306; H01L 2924/13062; H01L 2924/15311; H01L 2924/3025; H01L 2924/14; H01L 29/2003; H01L 29/42392; H01L 29/785; H01L 29/78681; H01L 29/78696; H01L 21/02175; H01L 21/0237; H01L 21/02458; H01L 21/0254; H01L 21/02636; H01L 21/2233; H01L 21/228; H01L 21/28008; H01L 21/28264; H01L 21/30604; H01L 21/3065; H01L 21/31116; H01L 21/4853; H01L 21/4857; H01L 21/56; H01L 21/743; H01L 21/762; H01L 21/76264; H01L 21/76805; H01L 21/76838; H01L 21/76879; H01L 21/76898; H01L 21/78; H01L 21/823456; H01L 21/84; H01L 2223/6677; H01L 2224/1181; H01L 2224/11848; H01L 2224/16245; H01L 2224/24146; H01L 2224/40247; H01L 2224/73221; H01L 2224/752; H01L 2224/81192; H01L 2225/06544; H01L 2225/06589; H01L 22/32; H01L 23/3107; H01L 23/3142; H01L 23/48; H01L 23/481; H01L 23/485; H01L 23/495; H01L 23/49503; H01L 23/49513; H01L 23/49524; H01L 23/49541; H01L 23/49548; H01L 23/49562; H01L 23/49575; H01L 23/49582; H01L 23/522; H01L 23/5226; H01L 23/5227; H01L 23/538; H01L 23/552; H01L 23/562; H01L 23/66; H01L 24/11; H01L 24/16; H01L 24/25; H01L 24/32; H01L 24/34; H01L 24/48; H01L 24/73; H01L 24/97; H01L 25/0657; H01L 25/50; H01L 27/0203; H01L 27/0688; H01L 27/088; H01L 27/092; H01L 27/13; H01L 27/222; H01L 28/10; H01L 28/65; H01L 28/75; H01L 2924/00014; H01L 2924/01104; H01L 2924/10253; H01L 2924/13091; H01L 2924/2064; H01L 2924/40102; H01L 2924/403; H01L 2924/40501; H01L 29/02; H01L 29/0649; H01L 29/0665; H01L 29/0669; H01L 29/0673; H01L 29/0676; H01L 29/16; H01L 29/20; H01L 29/201; H01L 29/205; H01L 29/207; H01L 29/4236; H01L 29/42376; H01L 29/66356; H01L 29/66409; H01L 29/66431; H01L 29/66439; H01L 29/66462; H01L 29/66522; H01L 29/66621; H01L 29/66666; H01L 29/66795; H01L 29/66803; H01L 29/66977; H01L 29/7391; H01L 29/772; H01L 29/775; H01L 29/7787; H01L 29/78; H01L 29/7827; H01L 43/02; H01L 43/12; H01L 51/5275; C08L 69/00; C08L 2205/025; C08L 55/02; C08L 81/04; C08L 83/10; C08L 2205/02; C08L 2205/03; C08L 2205/035; C08L 2207/066; C08L 23/06; C08L 23/0815; C08L 23/12; C08L 2207/20

See application file for complete search history.

(56) References Cited

U.S. PATENT DOCUMENTS

| | | | |
|---|---|---|---|
| 6,433,728 B1 * | 8/2002 | Krupp | G07C 9/00944 |
| | | | 341/173 |
| 6,849,936 B1 * | 2/2005 | Berman | H01L 23/552 |
| | | | 257/679 |
| 7,345,370 B2 | 3/2008 | Furukawa et al. | |
| 7,607,942 B1 * | 10/2009 | Van Swearingen | B29C 45/16 |
| | | | 29/828 |
| 2001/0018979 A1 * | 9/2001 | Dispenza et al. | 174/35 |
| 2003/0215664 A1 * | 11/2003 | Morales | B29C 33/38 |
| | | | 428/596 |
| 2005/0045369 A1 | 3/2005 | Ishimaru et al. | |
| 2005/0093111 A1 | 5/2005 | Berman et al. | |
| 2005/0199734 A1 | 9/2005 | Puschner et al. | |
| 2006/0049995 A1 | 3/2006 | Imaoka et al. | |
| 2006/0071308 A1 | 4/2006 | Tang et al. | |
| 2006/0256018 A1 * | 11/2006 | Soler Castany et al. | 343/700 |
| 2007/0013600 A1 * | 1/2007 | Sullivan | H01Q 1/38 |
| | | | 343/873 |
| 2007/0120742 A1 | 5/2007 | Soler Castany et al. | |
| 2008/0023696 A1 | 1/2008 | Yukawa et al. | |
| 2008/0036668 A1 | 2/2008 | White et al. | |
| 2008/0088517 A1 * | 4/2008 | Ansari | H01Q 1/38 |
| | | | 343/745 |
| 2008/0149736 A1 * | 6/2008 | Kim | H01Q 1/2283 |
| | | | 235/492 |
| 2008/0315385 A1 | 12/2008 | Gerber et al. | |

FOREIGN PATENT DOCUMENTS

| | | |
|---|---|---|
| GB | 2409345 | 6/2005 |
| WO | 20070048589 | 10/2006 |
| WO | 20080065640 | 6/2008 |
| WO | 20080099327 | 8/2008 |

* cited by examiner

SEMICONDUCTOR DEVICE WITH INTEGRATED ANTENNA AND MANUFACTURING METHOD THEREFOR

CROSS-REFERENCE TO RELATED APPLICATIONS

This application claims benefit of priority to U.S. Non-Provisional patent application Ser. No. 13/140,531 entitled "Semiconductor Device with Integrated Antenna and Manufacturing Method Therefor" and filed Jun. 17, 2011, which claims benefit of priority to Patent Application PCT/GB2009/051667 entitled "Semiconductor Device with Integrated Antenna and Manufacturing Method Therefor" and filed Dec. 8, 2009, which claims benefit of priority to Great Britain Patent Application 0822963.5 entitled "Antennas Conductive to Semiconductor Packaging Technology and a Process for Their Manufacture" filed Dec. 17, 2008, and issued as GB2466255 on Jun. 23, 2010, all of which are incorporated herein by reference in their entirety.

TECHNICAL FIELD

The present invention relates to the fabrication of semiconductor devices with integrated antennas and antenna excitation systems.

BACKGROUND

The electronics industry has seen significant integration in the functionality of radio frequency modules in the last 10 years. A module may now incorporate many semiconductor die and passive components, providing a complete functional system in a single integrated package, System in Package (SiP). This allows for ease of design into the final application. However, the electrical and mechanical interface between the radio system in the package and the antenna, which is needed to make it work, is still a burden to the designer. As well as meeting mechanical constraints, the designer must provide an effective antenna radiator that may require matching circuits to be positioned in the interconnection with the electronics package.

The semiconductor packaging industry fabricates modules in high volume multiple units. As many semiconductor modules as possible are covered with protective material in a single operation and the individual functional packages are then separated. Current practice includes the external attachment to electronics modules of antennas produced from sheet metal, for example by metal stamping or electrochemical etching, but such solutions do not provide full integration and their connection to the internal electronic circuits is problematical.

Commercial pressures require the antenna to be ever lower in cost and to occupy less volume in the target device. A method by which the antenna can be embodied directly into the highly integrated "System in Package" (SiP) devices would be a great boon to the semiconductor industry. To gain widespread acceptance, the solution should incur minimum impact on existing standard semiconductor assembly processes.

It is known from US 2006/0256018 to provide SiP devices with integral fractal antennas. The antennas may be formed by incorporating an electrically conductive element in or upon a plastics mould that encapsulates the semiconductor package. The chip in the package can be connected to the conductive element by way of a capacitive or inductive coupling.

WO 2008/065640 also discloses chip packages, such as SiP devices, with integrated RF antennas. The antennas may be coupled directly to the chip by vias, or may be coupled through radiating coupling slots.

BRIEF SUMMARY OF THE DISCLOSURE

Embodiments of the present invention seek to provide antenna designs and means of fabrication thereof that are consistent with high volume semiconductor manufacturing processes. The use of such processes and antenna designs will allow for integration of the radio with the antenna in the same semiconductor package to provide a complete module, an integrated RF system.

According to a first aspect of the present invention, there is provided a method of manufacturing a package comprising at least an integrated circuit embedded in an electrically non-conductive moulded material, wherein there is provided a die having a die cavity, the die cavity including at least one wall portion having protrusions or projections provided thereon, the integrated circuit is located within the die cavity, and the die cavity is then filled with an electrically non-conductive fluid material which subsequently hardens to form a solid over-mould, the protrusions or projections on the at least one wall portion forming a pattern on a corresponding surface of the solid over-mould, removing the solid over-mould with the embedded integrated circuit from the die, and forming at least one electrically conductive track in the pattern on the over-mould, and further comprising the addition of at least one capacitive, inductive or galvanic component electrically connecting at least two parts of the at least one electrically conductive track.

The electrically conductive track may be configured to act as an antenna or as a feed device exciting an external electromagnetically coupled antenna.

It is well known that the bandwidth and efficiency of any antenna are related to the dimensions of the antenna, measured in wavelengths at the required operating frequency. This fundamental constraint severely limits the potential application for antennas directly supported by an SIP package which may only be a few millimetres long, wide and high. The dimensions of a typical SIP package are too small to allow the design of an efficient antenna with useful bandwidth. This limitation can be overcome to some extent by reconfiguring the conducting members forming the antenna, for example by the use of switches which enable adjustment of the effective length of the conducting members or variable capacitive or inductive reactances which modify the resonant frequency of the structure.

A method whereby many of the advantages of embodiments of the present invention are obtained is provided by use of a conductive structure created on the outer surface of the package in accordance with embodiments of the present invention or otherwise to form an excitation means for a further conductive member, having dimensions suitable for efficient operation at the required operating frequency, dimensioned and located such that it is electromagnetically coupled to a conductive structure on or inside the SIP package.

When combined with the capability on or in the package to reconfigure or retune the exciting structure this arrangement can find many applications, for example for use in mobile television receivers in the UHF frequency band (470-860 MHz) and multi-band mobile telephones in the 850 MHz, 900 MHz, 1800 MHz, 1900 MHz and 2 GHz bands.

It is to be understood that the arrangements described herein will operate in transmit and/or receive modes. The arrangement is well suited to applications such as mobile phones, Radio Frequency Identification (RFID) devices and the recovery of small amounts of power from ambient electromagnetic fields (a process also known as power scavenging).

According to a second aspect of the present invention, there is provided a package comprising at least an integrated circuit embedded in an electrically non-conductive moulded material, the moulded material including at least one moulded pattern on at least one surface thereof, and at least one electrically conductive track in the pattern, further comprising at least one capacitive, inductive or galvanic component electrically connecting between at least two parts of the at least one electrically conductive track.

The at least one component may comprise at least one electronics component such as an inductor, a capacitor, a switch, a variable capacitance diode, a PIN diode and/or other semiconductor device and/or a Micro-Electro-Mechanical System (MEMS) component or combinations of one or more of these components, identical or different. These may optionally be adjustable so as to provide tuning functions or the ability to reconfigure the electrical circuit configuration of the conductors in response to control signals fed to the antenna members from electronic circuits within the module or package in order to change the operating frequency, radiation pattern or polarisation characteristics of the antenna.

According to a third aspect of the present invention, there is provided a moulded package according to the second aspect located close to a conductive element such that radiating currents are excited in the said conductive element by electromagnetic coupling when current flows in the said at least one electrically conductive track.

Such excitation may be created by either inductive or capacitive coupling or by a combination of both means. In applications in which operation is required concurrently at more than one operating frequency, separate coupling structures and/or separate radiating elements may be used for each required frequency band. In a similar manner separate coupling structures and radiating elements may be provided to provide different linear, elliptical or circular polarisations.

The coupling means may include the use of a component mounted to the surface of the SIP comprising a piece of dielectric material with its shape and dimensions suitably adapted, functioning generally as described in UK patents nos GB 2 403 069 and GB 2 409 345. Such an arrangement provides a more compact version of these earlier inventions and optionally integrates tuning capabilities appropriate for operation over wider frequency bands.

Embodiments of the present invention provide a method whereby an antenna, antenna feed system or any other conductive structure can be integrated into a semiconductor package with minimal impact on existing methods and processes.

In embodiments of the present invention, the assembled semiconductor devices and their interconnecting circuits are first over-moulded utilizing a conventional non-conductive moulding compound to cover the semiconductors inside the package to provide a protective covering. The die or chase used for this first over-moulding process is provided with a predetermined pattern of projecting ridges in each module location that cause a corresponding pattern of grooves to be formed in the resulting over-mould. This pattern may preferably be arranged to correspond to the conductor pattern required to form a radio antenna, but it may take any shape and the method can be adapted for other uses. The over-mould die may also be provided with internal projecting pins or other features to provide for one or more cylindrical or other shaped cavities for the antenna feed conductors, grounding metal or other features in the over-mould.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

BRIEF DESCRIPTION OF THE DRAWINGS

For a better understanding of the present invention and to show how it may be carried into effect, reference shall now be made by way of example to the accompanying drawings, in which:

FIG. 1 is a much-simplified conceptual drawing showing a semiconductor assembly 1 enclosed within a moulding die cavity formed by a base plate 2 and an upper cavity 3. During the over-moulding process according to prior art the space 4 between the assembly 1 and the surrounding die is filled with a suitable insulating material which hardens before the die is opened and the encapsulated semiconductor assembly is removed. According to established practice the die cavity may enclose a plurality of semiconductor assemblies which are encapsulated in a single moulding operation and are later separated (singulated) using a saw or other means.

FIG. 2 is a similarly simplified drawing showing an arrangement for a first over-moulding operation according to the present invention. The arrangement is similar to that of FIG. 1 except for the provision of one or more projecting ridges 5 on the internal surfaces of the mould cavity. The position, shape and dimensions of these projections may be chosen to provide any desired configuration for the conductive members. The projections are preferably designed to permit the removal of the hardened moulding from the die, having draught tapers and other required features in accordance with normal design practice. Optionally pins 6, 7 or other features may be incorporated into the design of the die to provide for the later provision of conducting members entirely surrounded by the over-moulded material. By way of example provision for such pins may be made to allow for the connection of an antenna feed point or a ground connection. The only constraint on the configuration of the projections and subsequently formed conductive members is that it must be possible to withdraw the completed moulding from the die, for example they may be of trapezoidal cross section 8 or triangular cross section 9. All the conducting members associated with an individual semiconductor assembly may be interconnected but optionally arrangements may be made for the formation of a plurality of separate conducting members by the provision of appropriate arrangements by which the conductive material used for the second over-mould may be fed into each of the corresponding plurality of provided voids.

FIG. 3 shows a module over-moulded in a first operation and now over-moulded in a second operation in which the voids created by the projections in the first over-moulding die have been filled with conducting material 10. Following the hardening of the conductive material 10 (which forms the at least one conductive track of embodiments of the invention) the moulding is removed from the die and singulated.

The process of singulation creates some constraints on the configuration of the conductive members but if suitably dimensioned conductive members are formed using the method here described out on the boundaries of the individual modules they will be divided into two parts if they lie along the sides of individual modules and into four parts if they lie at the corners of individual modules. Because some material is lost when the modules are divided, for example by the kerf of a saw, the dimensions of the pins required to create these members is substantially larger than the resulting dimensions of the pins after singulation. The use of large pins creates large cavities at the end of the first over-moulding process and these are more easily filled with conductive material at the second over-moulding process than would be the case if the pin and cavity dimensions are small.

Figure 1:
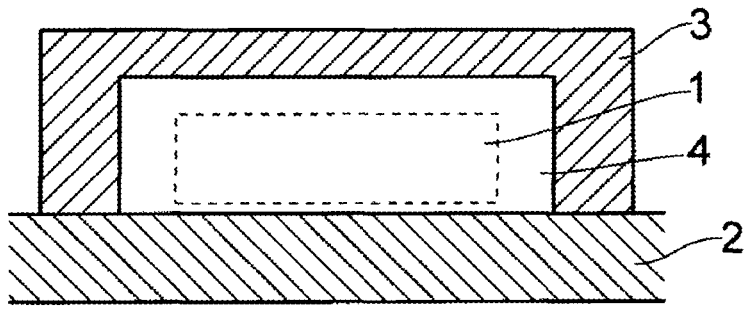
FIG. 1 shows a step in the manufacture of a semiconductor assembly according to the prior art.
Figure 2:
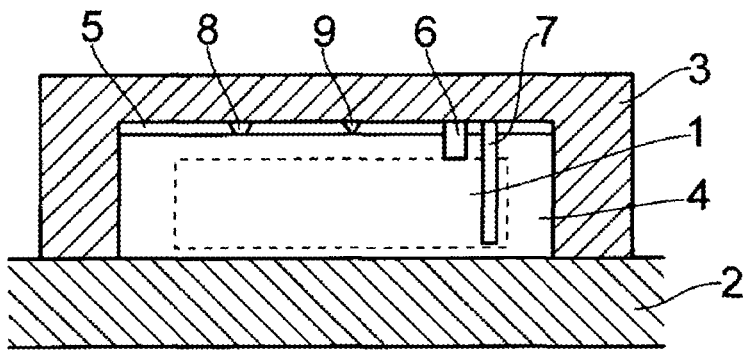
FIG. 2 shows a step in the manufacture of a semiconductor assembly according to an embodiment of the present invention.
Figure 3:
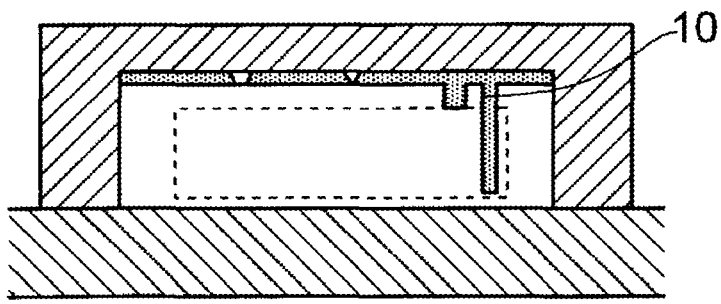
FIG. 3 shows a further step in the manufacture of a semiconductor assembly according to an embodiment of the present invention.
Figure 4:
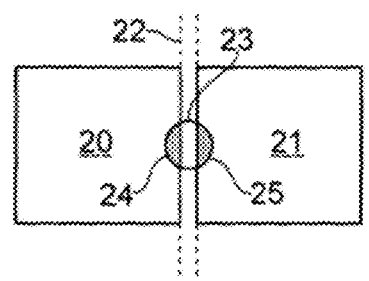
FIG. 4 shows a pair of semiconductor modules joined together on their proximate boundaries.

FIG. 4 shows two modules 20, 21 provided with a single conductive member 22 on their proximate boundaries. Following singulation the conductive member is divided by the saw kerf 23 into two parts 24, 25, there being one conductive member on each module.

Figure 5:
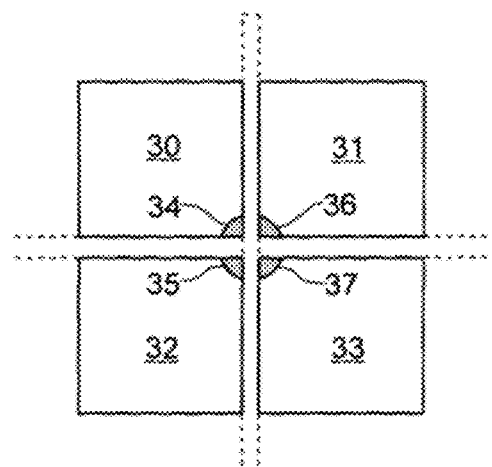
FIG. 5 shows four semiconductor modules joined together on their proximate boundaries.

FIG. 5 shows four modules 30, 31, 32, 33 provided with a single conductive member on their shared corner. Following singulation the conductive member is divided into four parts 34, 35, 36, 37, there being one conductive member on each module.

Figure 6:
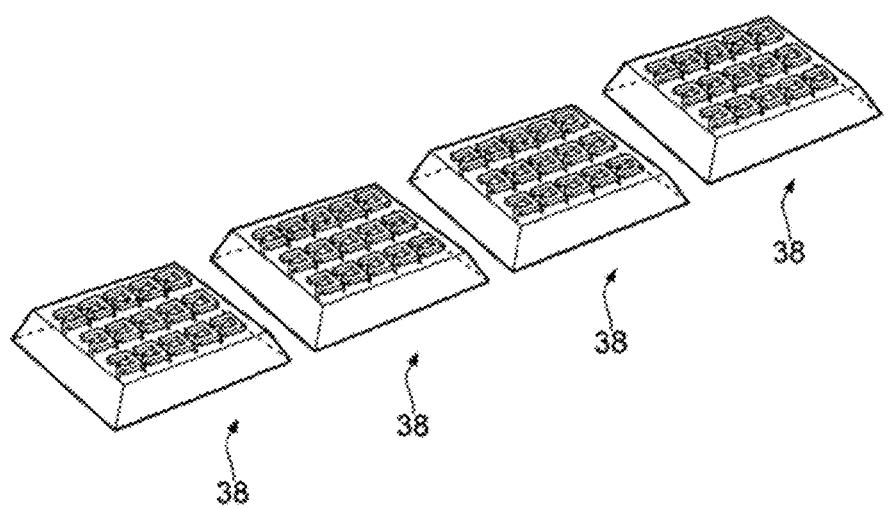
FIG. 6 shows four groups of semiconductor modules, each group comprising a plurality of modules joined together.

FIG. 6 by way of example shows four groups 38, each comprising a plurality of individual modules such as may optionally be over-moulded in a single operation during both the first and second over-moulding processes.

Figure 7:
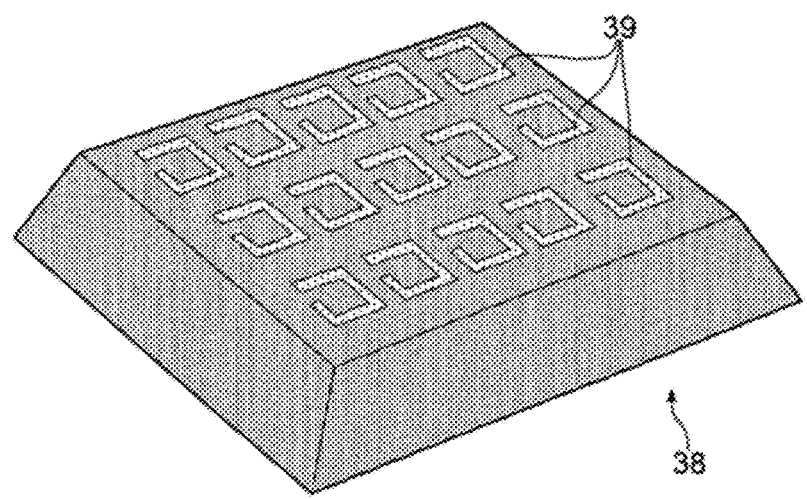
FIG. 7 shows one group of semiconductor modules each provided with a groove for subsequent filling with a conductive material.

FIG. 7 shows grooves 39 created for later filling with conductive material in a plurality of modules during the first over-moulding process.

Figure 8:
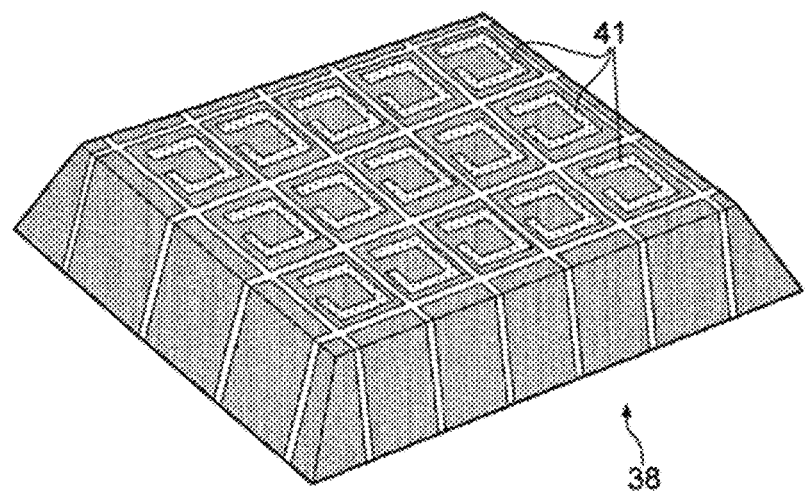
FIG. 8 shows the group of FIG. 7 with conductive material in the grooves prior to singulation along the lines indicated.

FIG. 8 shows a group 38 of modules with conductive members 41 incorporated by the method here described in their upper surfaces, preparatory to singulation along the lines shown.

Figure 9:
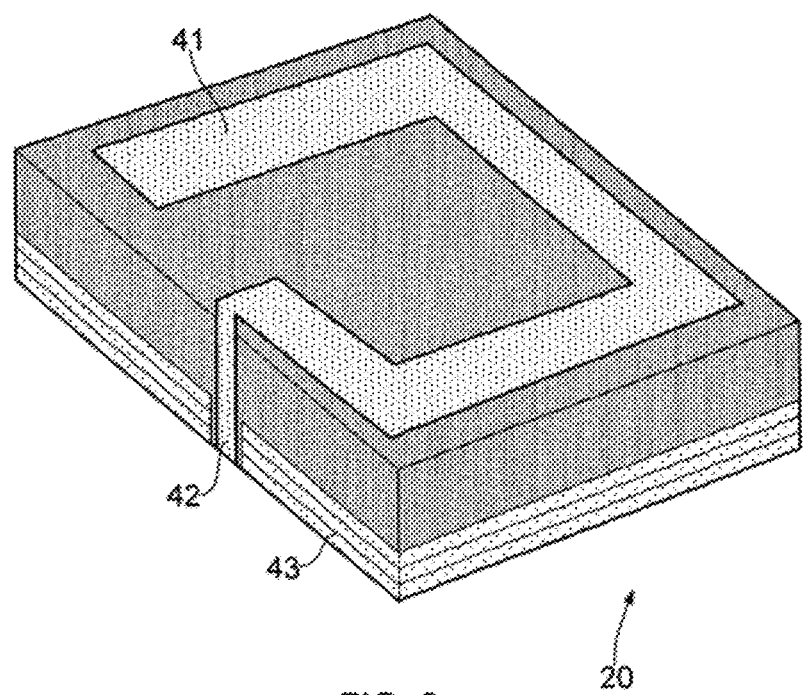
FIG. 9 shows an antenna formed from a conductive member.

FIG. 9 shows an antenna formed from a conductive member 41 and fed by a conductive member 42 which connects the said conductive member 41 to a multilayer printed circuit assembly 43 which forms part of the moulded module 20.

Figure 10:
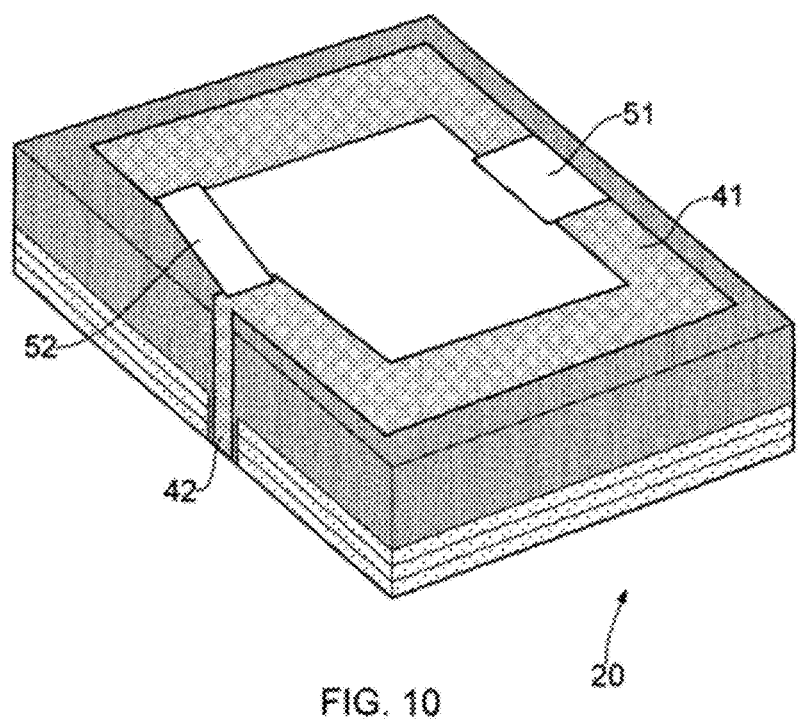
FIG. 10 shows a semiconductor module according to an embodiment of the present invention provided with additional electronics components.

FIG. 10 shows a module 20 designed and fabricated according to the present invention in which additional electronics components 51, 52 such as inductors, capacitors, switches or variable capacitance diodes have been connected to the conductive members 41 on the surface of the module. These may optionally adjustable provide tuning functions or the ability to reconfigure the geometrical configuration of the conductors in response to control signals fed to the antenna members from electronic circuits within the module.

Figure 11:
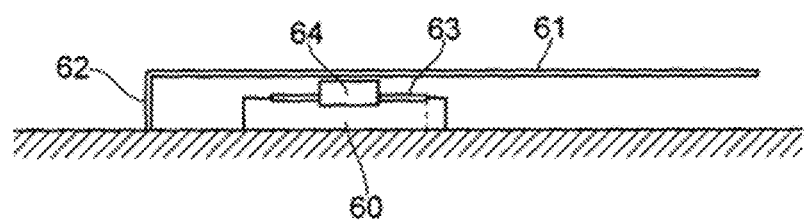
FIG. 11 shows a semiconductor module according to an embodiment of the present invention provided with additional electronics components and coupled to an external conductive radiating member.

FIG. 11 shows an electronics package 60 carrying a configuration of conductive members 61, 62 mounted in close proximity to a conductive radiating member 63 with enhanced capacitive coupling provided by means of a dielectric element 64 connected to one or more of the conductive members 61.

In a first embodiment the antenna pattern is fabricated using conductive resin, for example a conductive epoxy utilizing existing standard semiconductor packaging processes. The antenna feed is connected to the printed circuit board below through a mechanical via. The conductive epoxy flows through the via making an electrical connection with the via wall optionally using a vacuum process such as that used to underfill flip chip dies with a standard over-mould.

In a second embodiment the antenna pattern is fabricated through a selective metal plating process. A common available process suitable for this operation is a two shot process to create what is referred to as a Moulded Interconnect Device (MID) using an etchant to electroplate non-plateable thermo-plastic. Alternative currently available processes include physical vapour deposition, vacuum deposition, a metal paint process and printing using conductive ink. Other suitable processes are likely to appear in the future.

In a third embodiment the antenna pattern is fabricated through a non-selective metal plating process. Most metal plating processes will not adhere to plastic without the use of suitable surface preparation such as etching and/or the use of an appropriate catalyst. Selective pre-plating preparation could be applied to the grooves in the non-conductive over-mould material to facilitate adherence of the plated metal.

Alternatively, the metal could be plated over the whole surface and later remove from the top of the package, for example mechanically or by the use of an etching process.

In a fourth embodiment, one part of the conductive antenna structure is grounded for example through the addition of a cylindrical or other shaped post in the first injection mould chase that connects to ground metal on the substrate below the antenna structure.

In a fifth embodiment, multiple antenna patterns are fabricated on a single module through multiple antenna pattern ridges and feed posts in the mould cavity design. By this means grooves are provided for more than one antenna in the non-conductive epoxy over-mould after the first moulding process. The provision of multiple antennas has direct applications in the Multiple-Input Multiple-Output (MIMO) systems used in a number of high-speed radio communication systems.

In a sixth embodiment, an antenna pattern or multiple antenna patterns are produced on the substrate of the SiP package through conventional substrate fabrication means. This substrate may be any suitable material including Low Temperature Co-fired Ceramic (LTCC) or microwave laminate materials made from such materials as epoxy-glass laminate, PTFE-glass laminate or polybutylene terephthalate. An antenna or multiple antennas are also optionally fabricated in the over-mould according to the process outlined above. This implementation has direct applications in chip-to-chip wireless communication as well as antenna arrays.

In a seventh embodiment the antenna pattern in the over-moulded conductive material may incorporate one or more posts of cylindrical or other form for electrical connection to the underlying substrate, semiconductor devices or other components within the module. These electrical connections may be used for multiple feeds producing a multi-frequency antenna structure with multiple feed points as well as one or multiple ground connections to the antenna trace.

In an eighth embodiment, the antenna is fabricated as above without the via connection. The electrical connection is made after the second conductive epoxy cure through a selective metal process to wrap around the substrate to the bottom metal input/output pad. This embodiment may require an additional process if the antenna pattern is formed with conductive material but may be implemented during the same process if the antenna conductors are made by way of example using a selective metal plating process as described in the second embodiment as above. This method of fabrication has the advantage that the singulation process does not cut through a metal via when singulating the module and is advantageous if singulation is carried out using a saw process as it results in less wear on saw blades.

In a ninth embodiment, the electrical connection to the antenna pattern is made through the application of a conductive epoxy or conductive paint which electrically connects the antenna feed of conductive epoxy and a metal runner in the substrate that is cut during the saw singulation process.

In a tenth embodiment external conductive members forming an antenna are interconnected by active or passive electronics components to form one or more tunable or reconfigurable antennas. Such components may preferably be mounted to the conductors using established surface-mounted device techniques.

In an eleventh embodiment the conducting members on or close to the surface of the electronics package provided by the means described herein or otherwise are configured to cooperate with at least one external radiating conductive member by means of mutual electromagnetic coupling.

In a twelfth embodiment the electromagnetic coupling between the conductive members on or close to the surface of the package and the radiating conductive member is enhanced by the provision of a component comprising a dielectric material with high relative permittivity (greater than 10) to occupy at least a portion of a volume lying between opposed surfaces of the said members.

Any combination of the processes referred to above, or any equivalent processes for the deposition or formation of a multiplicity of conductive members into the grooves provide by the first over-moulding process according to embodiments of this invention. Such conductors may form part of one or more antennas or may provide other electrical or thermal functions.

Embodiments of the present invention find utility in all wireless applications where one or more packaged radio frequency semiconductor devices require connection to a transmitting and/or receiving antenna, for example the radio frequency circuits of a receiver, the output of a transmitter or a power amplifier. Integration according to the method here described provides a fully integrated system, reducing total cost, complexity, and the time required to design and implement the radio system.

What is claimed is:

1. A package comprising:
an integrated circuit embedded in an electrically non-conductive moulded material, the moulded material including at least one moulded groove pattern on at least one surface of the moulded material, and at least one electrically conductive track of conductive material disposed in the moulded groove pattern, wherein the at least one moulded groove pattern is positioned on an exterior surface of the moulded material and the moulded material is positioned between the integrated circuit and the at least one electrically conductive track of conductive material, wherein the integrated circuit is encapsulated within the moulded material, the moulded material is positioned between and in contact with both the at least one electrically conductive track of conductive material and the integrated circuit, and the at least one electrically conductive track of conductive material overlaps the integrated circuit in plan view.

2. The package of claim 1 wherein the at least one electrically conductive track is configured as an antenna.

3. The package of claim 1 further comprising:
at least one capacitive, inductive or galvanic component electrically connecting at least two parts of the at least one electrically conductive track, wherein the at least one capacitive, inductive or galvanic component comprises at least one electronics component selected from a group comprising: an inductor, a capacitor, a switch, a variable capacitance diode, a PIN diode, and a Micro-Electro-Mechanical System (MEMS) component.

4. The package of claim 1 further comprising:
at least one capacitive, inductive or galvanic component electrically connecting at least two parts of the at least one electrically conductive track, wherein the at least one capacitive, inductive or galvanic component has adjustable electrical characteristics.

5. The package of claim 1 further comprising:
at least one capacitive, inductive or galvanic component electrically connecting at least two parts of the at least one electrically conductive track, wherein the at least one electrically conductive track is configured as an antenna, and wherein the at least one capacitive, inductive or galvanic component is tunable.

6. The package of claim 1 further comprising:
at least one capacitive, inductive or galvanic component electrically connecting at least two parts of the at least one electrically conductive track, wherein the at least one electrically conductive track is configured as an antenna, and wherein at least two parts of the antenna are geometrically configurable in response to control signals fed to the antenna from electronic circuits within the package in order to change an operating frequency, a radiation pattern or polarisation characteristics of the antenna.

7. The package of claim 1 wherein the at least one electrically conductive track is formed of conductive resin, conductive epoxy, conductive ink, or conductive paint.

8. The package of claim 1 wherein at least one part of the at least one electrically conductive track is connected to ground.

9. The package of claim 1 wherein multiple electrically conductive tracks are fabricated on the package by way of multiple pattern ridges and feed posts formed in a die cavity.

10. The package of claim 1 wherein the package is formed on a substrate and wherein at least one additional electrically conductive track is provided on the substrate.

11. The package of claim 1 wherein the at least one electrically conductive track is electrically connected to an underlying substrate, semiconductor device or other component.

12. The package of claim 1 further comprising:
a plurality of electrically conductive tracks interconnected by one or more active or passive electronics components to form one or more tuneable or reconfigurable antennas.

13. The package of claim 1 wherein the package is located in proximity to an external radiating electrically conductive member so that the at least one electrically conductive track can electromagnetically couple with the external radiating electrically conductive member.

14. The package of claim 1 further comprising:
separate coupling structures for each supported frequency band.

15. The package of claim 1 further comprising:
separate radiating elements for each supported frequency band.

16. The package of claim 1 further comprising:
separate coupling structures or separate radiating elements for each supported polarisation.

17. The package of claim 1 wherein the groove has a substantially trapezoidal shaped cross section.

18. The package of claim 1 wherein the groove has a substantially triangular shaped cross section.

19. The package of claim 1 wherein the integrated circuit includes a width, a length, and a thickness, wherein the thickness is less than the width, wherein the thickness is less than the length, and wherein a majority of the at least one electrically conductive track overlaps the integrated circuit along the width and length.

20. A device comprising:
a moulded material comprising a groove pattern on a surface of the moulded material;
an electrically conductive material disposed within the groove pattern as an electrically conductive track; and
an integrated circuit embedded in the moulded material, the integrated circuit being coupled to the electrically conductive material, and the moulded material being positioned between the integrated circuit and the electrically conductive material disposed within the groove pattern, wherein the integrated circuit is encapsulated within the moulded material, the moulded material is positioned between and in contact with both the electrically conductive track and the integrated circuit, and the electrically conductive track overlaps the integrated circuit in plan view.

21. The device of claim 20 wherein the electrically conductive track is coupled to the integrated circuit by a capacitive, inductive or galvanic component.

22. The device of claim 21 wherein the capacitive, inductive or galvanic component comprises a component selected from a group comprising:
an inductor, a capacitor, a switch, a variable capacitance diode, a PIN diode, and a Micro-Electro-Mechanical System (MEMS) component.

23. An antenna module comprising:
an integrated circuit encapsulated within an over-moulded material;
a moulded groove disposed on an exterior surface of the over-moulded material; and
an electrically conductive material disposed within the moulded groove, wherein the integrated circuit is encapsulated within the over-moulded material, the over-moulded material is positioned between and in contact with both the electrically conductive material and the integrated circuit, and the electrically conductive material overlaps the integrated circuit in plan view.

24. A package comprising:
an integrated circuit embedded in an electrically non-conductive moulded material, the moulded material including at least one moulded groove pattern on at least one surface of the moulded material, and at least one electrically conductive track of conductive material disposed in the moulded groove pattern, wherein the electrically conductive track overlaps the embedded integrated circuit in plan view of the package, the integrated circuit is encapsulated within the moulded material, and the moulded material is positioned between and in contact with both the at least one electrically conductive track and the integrated circuit.

* * * * *